(12) United States Patent
Doris et al.

(10) Patent No.: US 7,388,259 B2
(45) Date of Patent: Jun. 17, 2008

(54) STRAINED FINFET CMOS DEVICE STRUCTURES

(75) Inventors: Bruce B. Doris, Brewster, NY (US); Dureseti Chidambarrao, Weston, CT (US); MeiKei Ieong, Wappingers Falls, NY (US); Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/536,483

(22) PCT Filed: Nov. 25, 2002

(86) PCT No.: PCT/US02/37931

§ 371 (c)(1),
(2), (4) Date: May 24, 2005

(87) PCT Pub. No.: WO2004/049406

PCT Pub. Date: Jun. 10, 2004

(65) Prior Publication Data

US 2006/0057787 A1    Mar. 16, 2006

(51) Int. Cl.
*H01L 29/94* (2006.01)
(52) U.S. Cl. .................... 257/351; 257/347; 257/350; 257/401
(58) Field of Classification Search ............ 257/369, 257/401, 350, 351, 354, 640, 649, E27.108, 257/E29.028, E29.136, 626, E27.062, E29.134, 257/E29.137

See application file for complete search history.

(56) References Cited

U.S. PATENT DOCUMENTS

| 3,602,841 | A | 8/1971 | McGroddy |
| 4,665,415 | A | 5/1987 | Esaki et al. |
| 4,853,076 | A | 8/1989 | Tsaur et al. |
| 4,855,245 | A | 8/1989 | Neppl et al. |
| 4,952,524 | A | 8/1990 | Lee et al. |
| 4,958,213 | A | 9/1990 | Eklund et al. |
| 5,006,913 | A | 4/1991 | Sugahara et al. |

(Continued)

FOREIGN PATENT DOCUMENTS

| JP | 64-76755 | 3/1989 |
| JP | PUPA2003273240 | 9/2003 |
| WO | WO02043151 | 5/2002 |

OTHER PUBLICATIONS

A. Shimizu et al., "Local Mechanical-Stress Control (LMC): A New Technique for CMOS-Performance Enhancement", International Electron Devices Meeting 2001. IEDM Technical Digest. 2001 IEEE, pp. 19.4.1-19.4.4.

(Continued)

*Primary Examiner*—Minhloan Tran
*Assistant Examiner*—Benjamin Tzu-Hung Liu
(74) *Attorney, Agent, or Firm*—Joseph P. Abate

(57) ABSTRACT

A semiconductor device structure, includes a PMOS device 200 and an NMOS device 300 disposed on a substrate 1,2, the PMOS device including a compressive layer 6 stressing an active region of the PMOS device, the NMOS device including a tensile layer 9 stressing an active region of the NMOS device, wherein the compressive layer includes a first dielectric material, the tensile layer includes a second dielectric material, and the PMOS and NMOS devices are FinFET devices 200, 300.

8 Claims, 17 Drawing Sheets

APPLY BLOCK MASK AND REMOVE TENSILE FILM FROM p-FinFET, REMOVE BLOCK MASK
FINAL DEVICE STRUCTURE
PARALLEL VIEW

U.S. PATENT DOCUMENTS

| | | | |
|---|---|---|---|
| 5,060,030 | A | 10/1991 | Hoke |
| 5,081,513 | A | 1/1992 | Jackson et al. |
| 5,108,843 | A | 4/1992 | Ohtaka et al. |
| 5,134,085 | A | 7/1992 | Gilgen et al. |
| 5,310,446 | A | 5/1994 | Konishi et al. |
| 5,354,695 | A | 10/1994 | Leedy |
| 5,371,399 | A | 12/1994 | Burroughes et al. |
| 5,391,510 | A | 2/1995 | Hsu et al. |
| 5,459,346 | A | 10/1995 | Asakawa et al. |
| 5,471,948 | A | 12/1995 | Burroughes et al. |
| 5,557,122 | A | 9/1996 | Shrivastava et al. |
| 5,561,302 | A | 10/1996 | Candelaria |
| 5,565,697 | A | 10/1996 | Asakawa et al. |
| 5,571,741 | A | 11/1996 | Leedy |
| 5,592,007 | A | 1/1997 | Leedy |
| 5,592,018 | A | 1/1997 | Leedy |
| 5,670,798 | A | 9/1997 | Schetzina |
| 5,679,965 | A | 10/1997 | Schetzina |
| 5,683,934 | A | 11/1997 | Candelaria |
| 5,840,593 | A | 11/1998 | Leedy |
| 5,861,651 | A | 1/1999 | Brasen et al. |
| 5,880,040 | A | 3/1999 | Sun et al. |
| 5,940,716 | A | 8/1999 | Jin et al. |
| 5,940,736 | A | 8/1999 | Brady et al. |
| 5,946,559 | A | 8/1999 | Leedy |
| 5,960,297 | A | 9/1999 | Saki |
| 5,989,978 | A | 11/1999 | Peidous |
| 6,008,126 | A | 12/1999 | Leedy |
| 6,025,280 | A | 2/2000 | Brady et al. |
| 6,046,464 | A | 4/2000 | Schetzina |
| 6,066,545 | A | 5/2000 | Doshi et al. |
| 6,090,684 | A | 7/2000 | Ishitsuka et al. |
| 6,107,143 | A | 8/2000 | Park et al. |
| 6,117,722 | A | 9/2000 | Wuu et al. |
| 6,133,071 | A | 10/2000 | Nagai |
| 6,165,383 | A | 12/2000 | Chou |
| 6,221,735 | B1 | 4/2001 | Manley et al. |
| 6,228,694 | B1 | 5/2001 | Doyle et al. |
| 6,246,095 | B1 | 6/2001 | Brady et al. |
| 6,255,169 | B1 | 7/2001 | Li et al. |
| 6,261,964 | B1 | 7/2001 | Wu et al. |
| 6,265,317 | B1 | 7/2001 | Chiu et al. |
| 6,274,444 | B1 | 8/2001 | Wang |
| 6,281,532 | B1 | 8/2001 | Doyle et al. |
| 6,284,623 | B1 | 9/2001 | Zhang et al. |
| 6,284,626 | B1 | 9/2001 | Kim |
| 6,319,794 | B1 | 11/2001 | Akatsu et al. |
| 6,342,410 | B1 | 1/2002 | Yu |
| 6,361,885 | B1 | 3/2002 | Chou |
| 6,362,082 | B1 | 3/2002 | Doyle et al. |
| 6,368,931 | B1 | 4/2002 | Kuhn et al. |
| 6,403,486 | B1 | 6/2002 | Lou |
| 6,403,975 | B1 | 6/2002 | Brunner et al. |
| 6,406,973 | B1 | 6/2002 | Lee |
| 6,413,802 | B1 | 7/2002 | Hu et al. |
| 6,433,609 | B1 | 8/2002 | Voldman |
| 6,458,662 | B1 | 10/2002 | Yu |
| 6,461,936 | B1 | 10/2002 | von Ehrenwall |
| 6,476,462 | B2 | 11/2002 | Shimizu et al. |
| 6,483,171 | B1 | 11/2002 | Forbes et al. |
| 6,493,497 | B1 | 12/2002 | Ramdani et al. |
| 6,498,358 | B1 | 12/2002 | Lach et al. |
| 6,501,121 | B1 | 12/2002 | Yu et al. |
| 6,506,652 | B2 | 1/2003 | Jan et al. |
| 6,509,618 | B2 | 1/2003 | Jan et al. |
| 6,521,964 | B1 | 2/2003 | Jan et al. |
| 6,531,369 | B1 | 3/2003 | Ozkan et al. |
| 6,531,740 | B2 | 3/2003 | Bosco et al. |
| 6,573,172 | B1 | 6/2003 | En et al. |
| 6,621,392 | B1 | 9/2003 | Volant et al. |
| 6,635,506 | B2 | 10/2003 | Volant et al. |
| 2001/0009784 | A1 | 7/2001 | Ma et al. |
| 2002/0063292 | A1 | 5/2002 | Armstrong et al. |
| 2002/0074598 | A1 | 6/2002 | Doyle et al. |
| 2002/0081794 | A1* | 6/2002 | Ito ............................ 438/200 |
| 2002/0086472 | A1 | 7/2002 | Roberds et al. |
| 2002/0086497 | A1 | 7/2002 | Kwok |
| 2002/0090791 | A1 | 7/2002 | Doyle et al. |
| 2003/0032261 | A1 | 2/2003 | Yeh et al. |
| 2003/0040158 | A1 | 2/2003 | Saitoh |
| 2003/0057184 | A1 | 3/2003 | Yu et al. |
| 2003/0067035 | A1 | 4/2003 | Tews et al. |
| 2004/0075122 | A1* | 4/2004 | Lin et al. .................... 257/288 |

OTHER PUBLICATIONS

S. Ito et al., "Effect of Mechanical Stress Induced by Etch-Stop Nitride: Impact on Deep-Submicron Transistor Performance", Microelectronics and Reliability, Elsevier Science Ltd., GB, vol. 42, No. 2, Feb. 2002, pp. 201-209.

S. Ito et al., "Mechanical Stress Effect of Etch-Stop Nitride and its Impact on Deep Submicron Transistor Design", IEDM Technical Digest, 2000 IEEE, pp. 10.7.1-10.7.4.

Kern Rim, et al., "Transconductance Enhancement in Deep Submicron Strained-Si n-MOSFETs". International Electron Devices Meeting, 26, 8, 1, IEEE, Sep. 1998.

Kern Rim, et al., "Characteristics and Device Design of Sub-100 nm Strained Si N- and PMOSFETs." 2002 Symposium on VLSI Technology Digest of Technical Papers, IEEE, pp. 98-99.

Gregory Scott, et al., "NMOS Drive Current Reduction Caused by Transistor Layout and Trench Isolation Induced Stress." International Electron Devices Meeting, 34.4.1, IEEE, Sep. 1999.

F. Ootsuka, et al., "A Highly Dense, High-Performance 130nm Node CMOS Technology for Large Scale System-on-a-Chip Application." International Electron Devices Meeting, 23.5.1, IEEE, Apr. 2000.

Shinya Ito, et al., "Mechanical Stress Effect of Etch-Stop Nitride and its Impact on Deep Submicron Transistor Design," International Electron Devices Meeting, 10.7.1, IEEE, Apr. 2000.

A. Shimizu, et al., "Local Mechanical-Stress Control (LMC): A New Technique for CMOS-Performance Enhancement." International Electron Devices Meeting, IEEE, Mar. 2001.

K. Ota, et al., "Novel Locally Strained Channel Technique for High Performance 55nm CMOS." International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structures." Paper 6.2, pp. 140-143.

C.J. Huang, et al., "Temperature Dependence and Post-Stress Recovery of Hot Electron Degradation Effects in Bipolar Transistors." IEEE 1991 Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors," pp. 1-5.

H. Li, et al., "Design of W-Band VCOs with High Output Power for Potential Application in 77 GHz Automotive Radar Systems." 2003 IEEE GaAs Digest, pp. 263-266.

H. Wurzer, et al., "Annealing of Degraded npn-Transistors- Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al., "Analysis of the Temperature Dependence of Hot-Carrier-Induced Degradation in Bipolar Transistors for BiCMOS." IEEE Transactions on Electron Devices, vol. 41, No. 6, Jun. 1994, pp. 978-987.

* cited by examiner

STRAINED FINFET CMOS DEVICE STRUCTURES

TECHNICAL FIELD

The present invention relates to double gate semiconductor device structures and, more particularly, to FinFET devices.

BACKGROUND ART

Double gate semiconductor device structures are promising candidates for future generation microelectronics devices, because of the ability to obtain near ideal sub-threshold slope, absence of body-effect, immunity to short-channel effect, and very high current driveability. One double gate device structure of technological relevance is the FinFET. The FinFET is particularly attractive because of the relative simplicity of manufacture compared to other double gate devices. The channel for the FinFET is a thin rectangular island of Si, commonly referred to as the Fin. The gate wraps around the Fin so that the channel is gated on both sides of the vertical portions of the Fin structure, providing gate control which is superior to planar single gate MOSFETs.

FinFETs are well known. See, for example, U.S. Pat. No. 6,413,802, entitled "FinFET Transistor Structures Having a Double Gate Channel Extending Vertically from a Substrate and Methods of Manufacture" by Hu et al., filed Oct. 23, 2000, issued Jul. 2, 2002, which is hereby incorporated in its entirety by reference. FinFETs having enhanced mobility are also known. See, for example, U.S. Patent Application No. 2002/0063292 A1, entitled "CMOS Fabrication Process Utilizing Special Transistor Orientation" by Armstrong et al., filed Nov. 29, 2000, published May 30, 2002, which is hereby incorporated in its entirety by reference. This prior art method is directed at improving nFET mobility and, therefor, only limited improvement in CMOS circuits can be attained. Thus, a need exists for a method to improve mobility for p-FinFETs and n-FinFETs which are situated on the same wafer.

However, the present inventors believe that improvements in utilizing stressing layers to enhance mobility are achievable.

DISCLOSURE OF INVENTION

According to the present invention, a semiconductor device structure includes a PMOS device and an NMOS device disposed on a substrate, the PMOS device including a compressive layer stressing an active region of the PMOS device, the NMOS device including a tensile layer stressing an active region of the NMOS device, wherein the compressive layer includes a first dielectric material, the tensile layer includes a second dielectric material, and the PMOS and NMOS devices are FinFET devices.

This invention is directed to a novel strained FinFET device structures for enhanced mobility. The integration scheme incorporates a new process flow that induces compressive stress in the longitudinal direction for the p-FinFET while also inducing tensile stress in the longitudinal direction for the n-FinFET. These stresses significantly enhance mobility and, thus, enhance device performance. In the invention described herein, the longitudinal stress induced in the channel is enhanced considerably from what can be obtained in standard planar MOSFETs, because the stressing film is applied from two sides of a thin FinFET, instead of on the surface of an SOI layer or bulk substrate.

It is a principal object of the present invention to enhance mobility in double gate CMOS device structures.

It is an additional object of the present invention to enhance mobility in FinFET device structures.

It is a further object of the present invention to improve methods of fabricating strained FinFET device structures.

The invention and other objects and features thereof will be more readily apparent from the following detailed description when taken in conjunction with the following drawing figures.

BEST MODE FOR CARRYING OUT THE INVENTION

Figure 16:
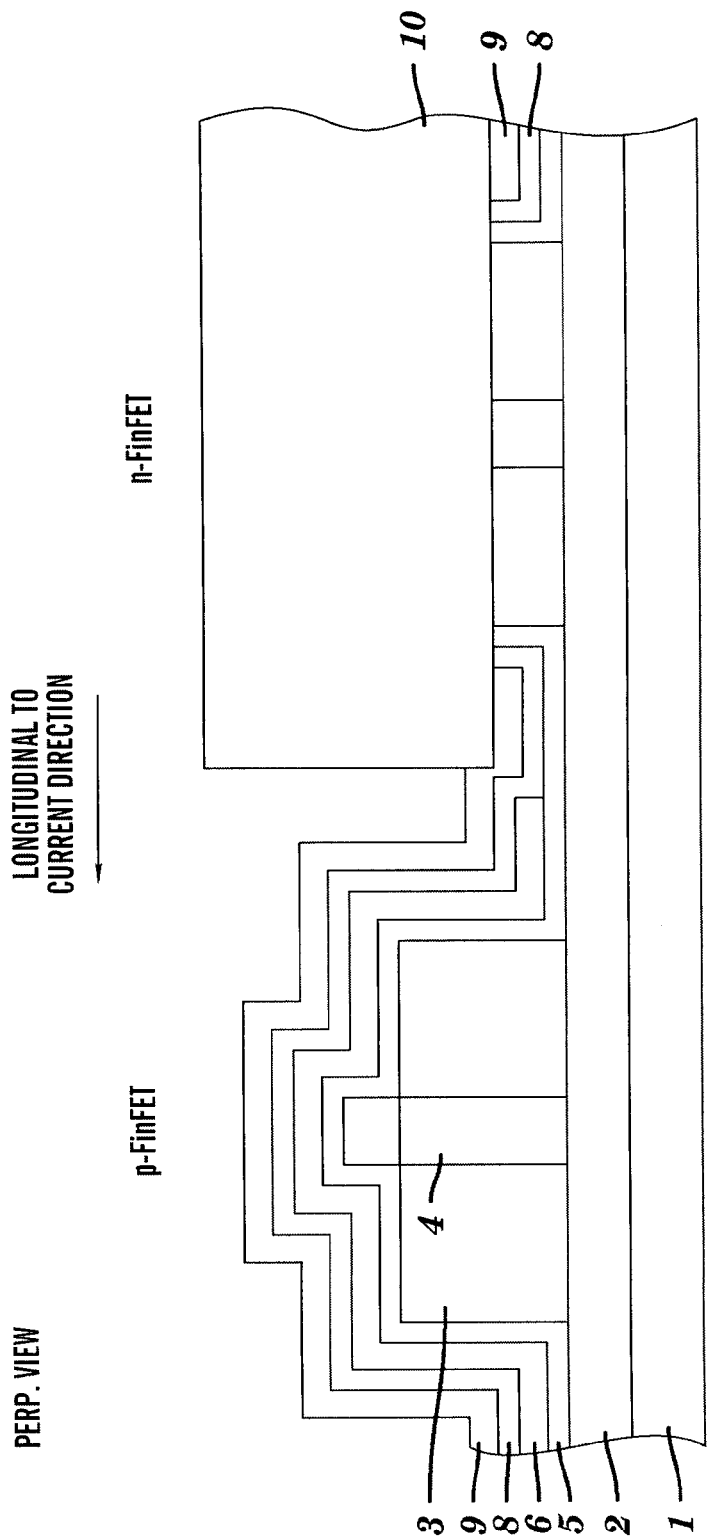
Figure 17:
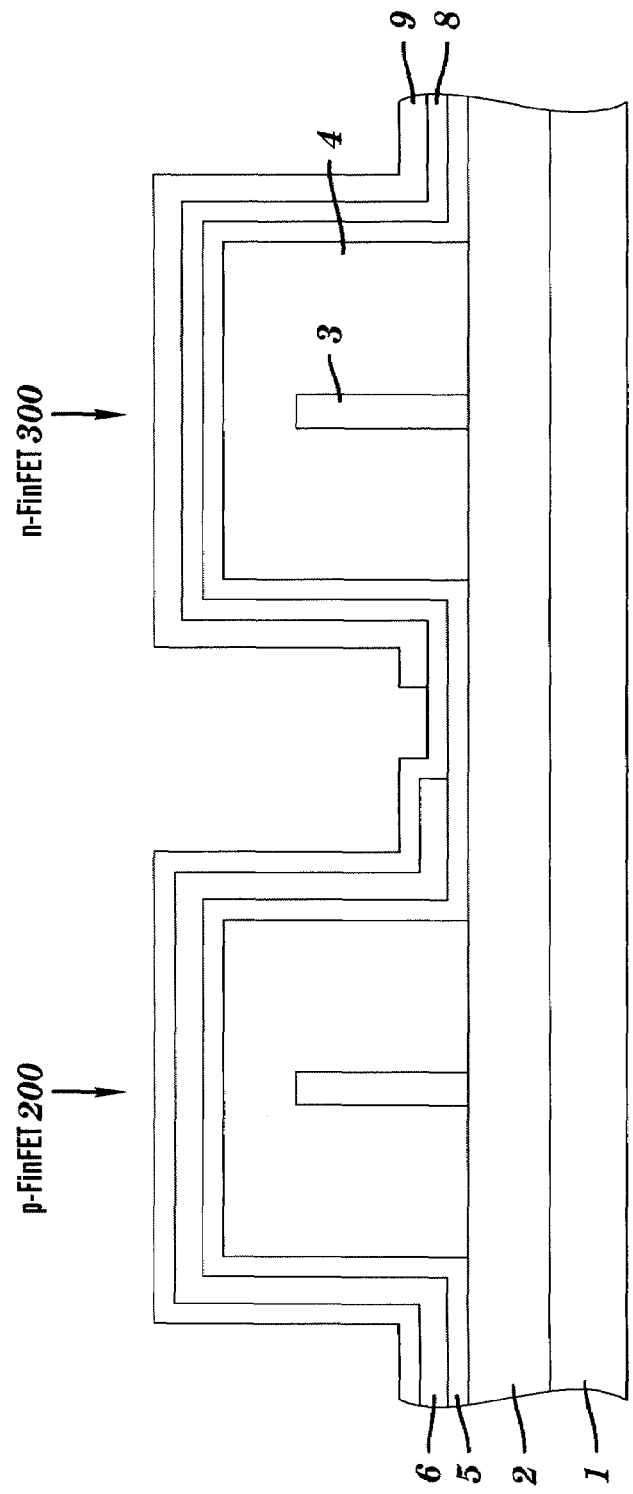

The present invention is directed to a novel FinFET semiconductor device structure and a method of manufacturing such structure. A preferred final structure according to the present invention is shown in FIGS. 16, 17.

Figure 1:
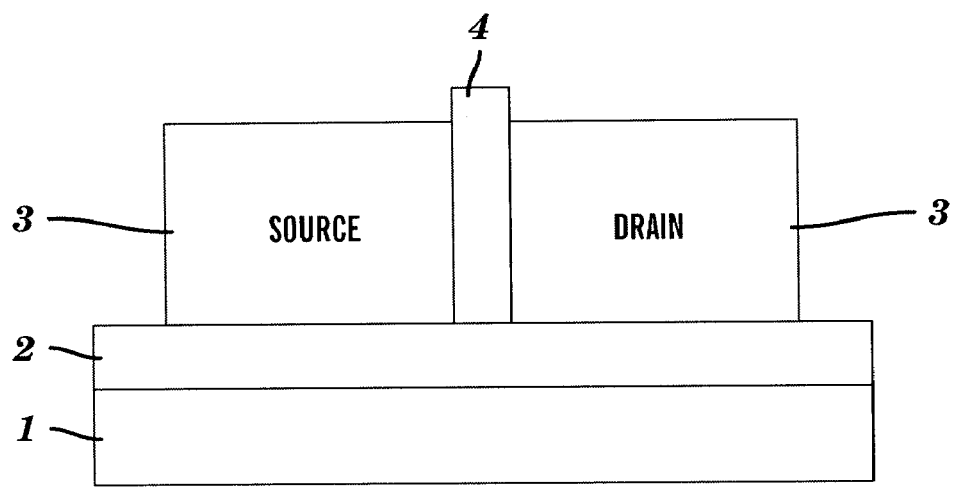
FIGS. 1 and 2 schematically show perpendicular (to Fin) and parallel (to Fin) views of a FinFET according to the prior art.
Figure 2:
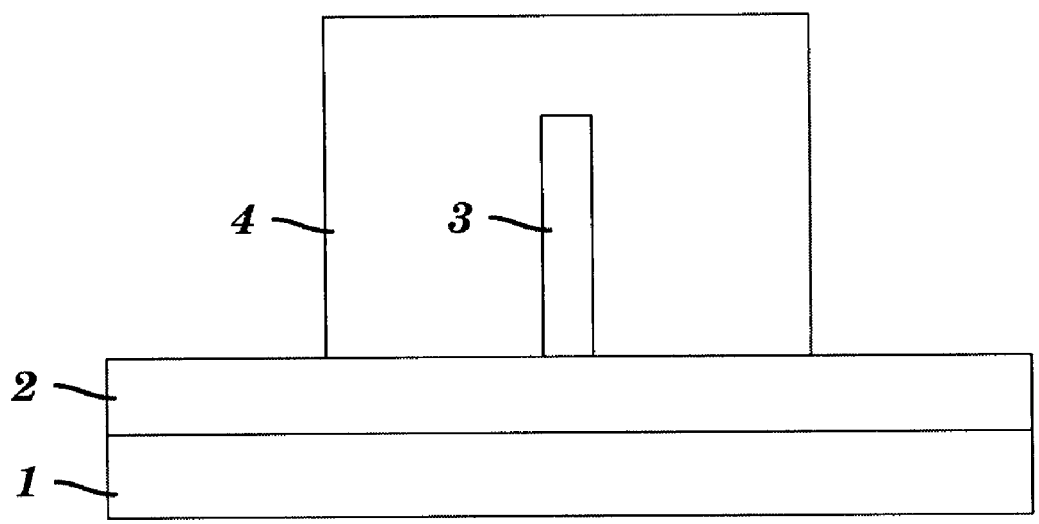
Figure 3:
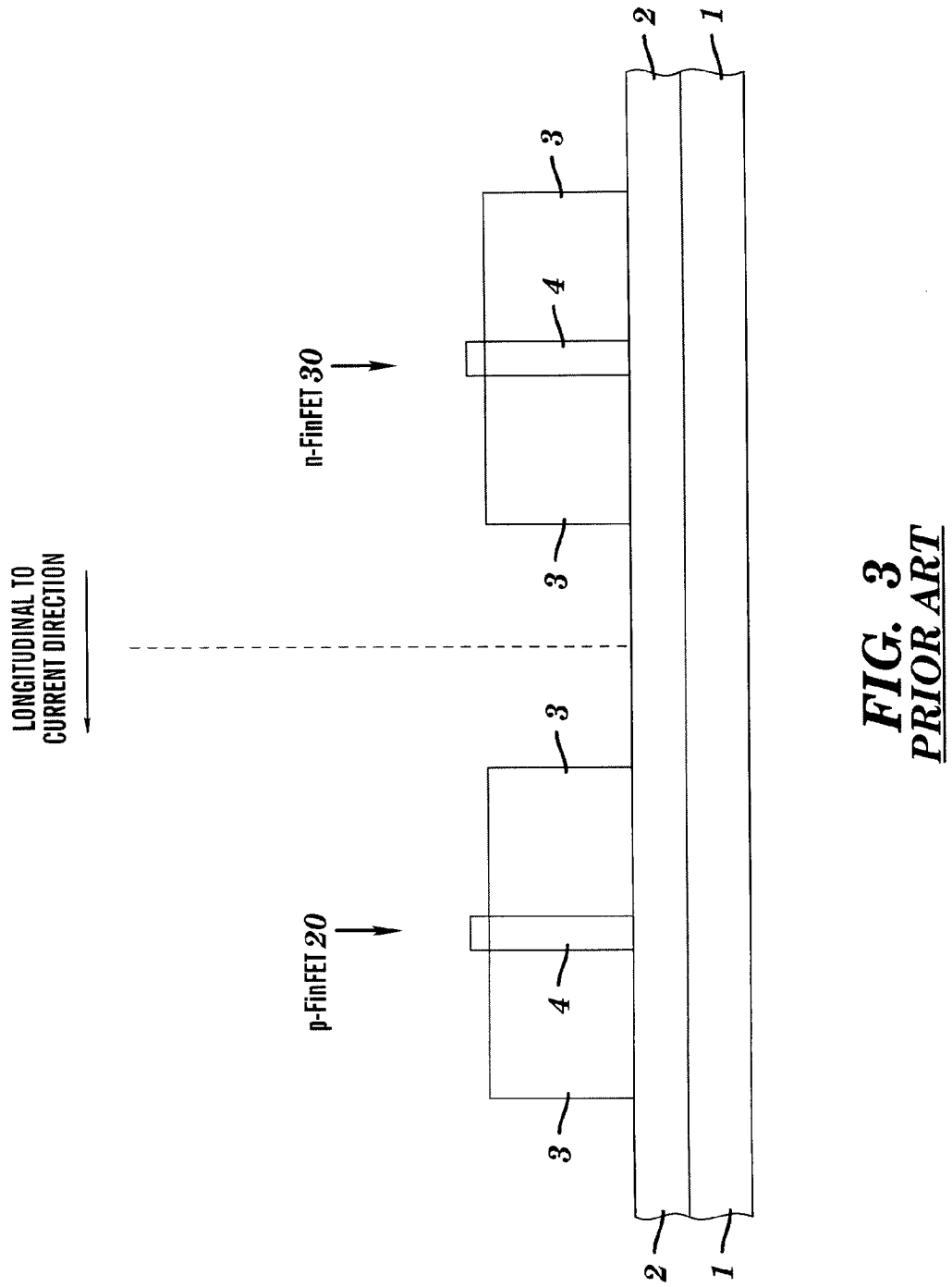
FIG. 3 schematically shows a perpendicular view of a FinFET semiconductor device structure according to the prior art.

Referring now to the remaining figures and FIGS. 1-3 in particular, there are shown known FinFET devices (FIGS. 1, 2) and device structures (FIG. 3).

To begin, standard or conventional FinFET device manufacture processing is followed through the patterning and etching of the Fins, formation of gate dielectric and conductors, sidewall spacers (not shown), source/drain doping, and salicidation. Following salicidation, the gate sidewall spacers are removed, to facilitate the processing which will induce strain in the Fins according to the present invention.

More particularly, as described with reference to FIG. 3, an SOI wafer, for example, is provided. The SOI wafer includes a substrate 1, disposed underneath a buried $SiO_2$ layer 2 as shown in FIG. 3. On top of the buried $SiO_2$ layer 2, is a Silicon on Insulator (SOI) layer which is patterned into regions forming the active area of each device shown as a FIN 3 in FIGS. 1, 2 and 3. The Fin may be formed by standard lithography and etching operations well known in the art. Alternatively, a known side wall image transfer method may be used to form each Fin 3.

After the Fin has been formed, a sacrificial oxidation procedure which is well known in the art may be performed to remove any damage from the Fin etch procedure. The sacrificial oxide layer can be used as a screen to prevent channeling during well implantation, if well implantation is used to adjust the threshold voltage of the FinFET device.

The sacrificial oxide is next removed by a dry or wet etch chemistry. For example, a dilute hydrofluoric acid may be used to remove the sacrificial oxide. After the sacrificial oxide removal, a gate dielectric may be formed. The gate oxidation may be a thermal $SiO_2$, a nitrided $SiO_2$ or oxy nitride. The gate dielectric may be a high K material like $TaO_5$, $HfO_2$, or any other gate dielectric material.

The gate electrode material is next deposited on the entire wafer, after which a lithography and etching procedure may be carried out. The gate electrode is labeled electrode 4 in the diagram.

After gate formation, a reoxidation operation, which is well known in the art, may be used to improve gate dielectric characteristics. The gate re-ox may also be omitted.

At this point in the process flow, the source/drain extensions may be implanted, in another approach, an offset spacer may be used to create a distance between the gate edge and the implanted Fin region. A lithography mask may be used to block nFET regions from being implanted while allowing the pFET regions to be implanted as is common to conventional CMOS process technology. A similar operation can be used to implant the nFET regions while blocking the pFET regions.

After the source drain extension regions have been formed, an extension anneal may be used to heal the damage created by the ion implantation. In an alternate approach, the anneal may be omitted. Next, the deep source drain spacers are fabricated by depositing a SiN film in the range of 100 Å to 1000 Å, after which a highly directional etch is performed to remove the SiN film from the horizontal surfaces while leaving the film on the vertical portions of the gate electrode.

A block mask and ion implantation are now used to form the source and drain regions for the nFET device region 30 and pFET device region 20 as is standard in CMOS process technology. A conventional rapid thermal annealing process is next used to activate the junctions formed by the implantation. After this, a conventional salicide process using $CoSi_2$, TiSi, NiSi or any other silicide known in the art is performed.

Figure 4:
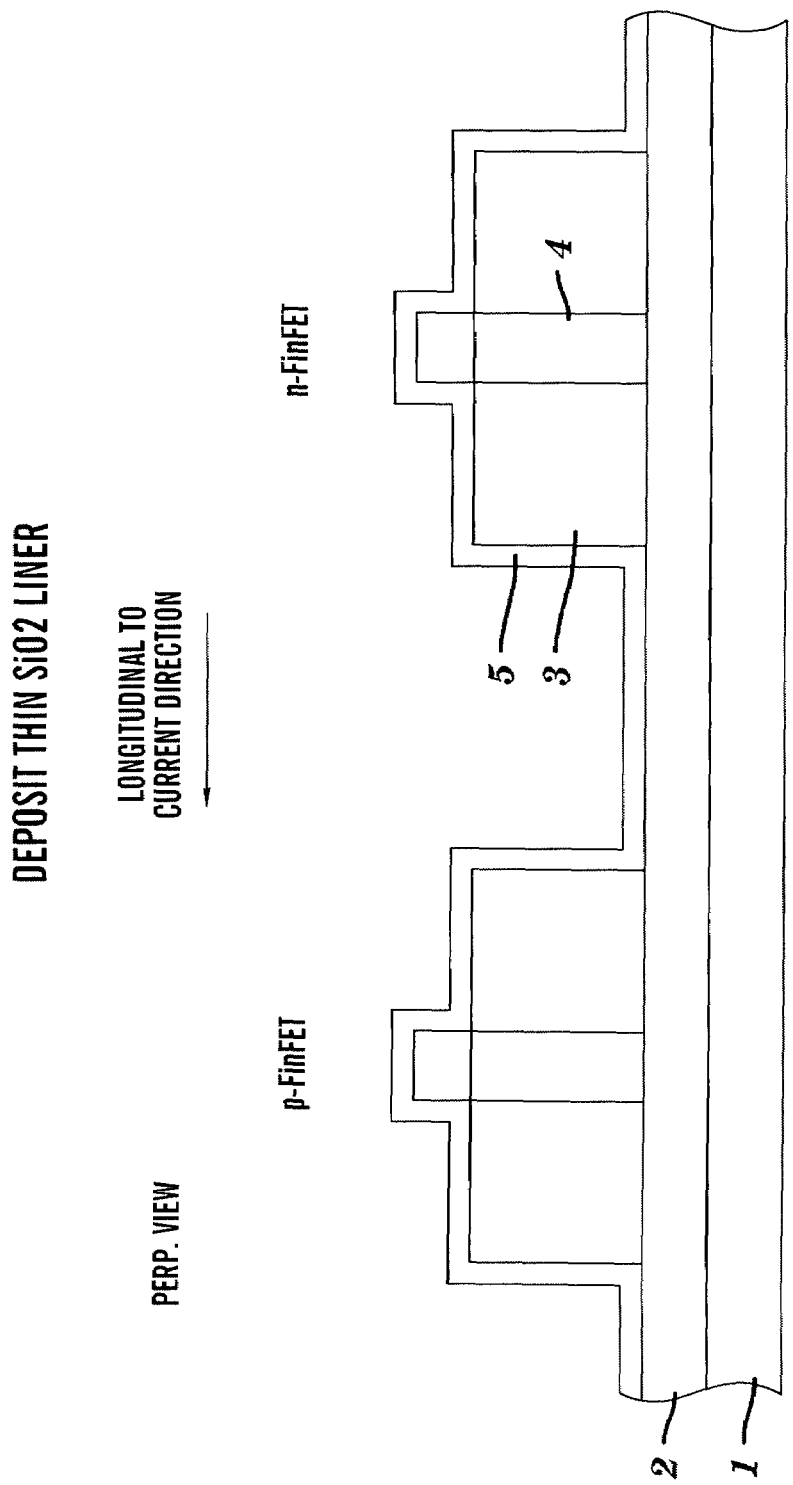
FIGS. 4-17 schematically show various views of intermediate and final FinFET semiconductor device structures according to the present invention.
Figure 5:
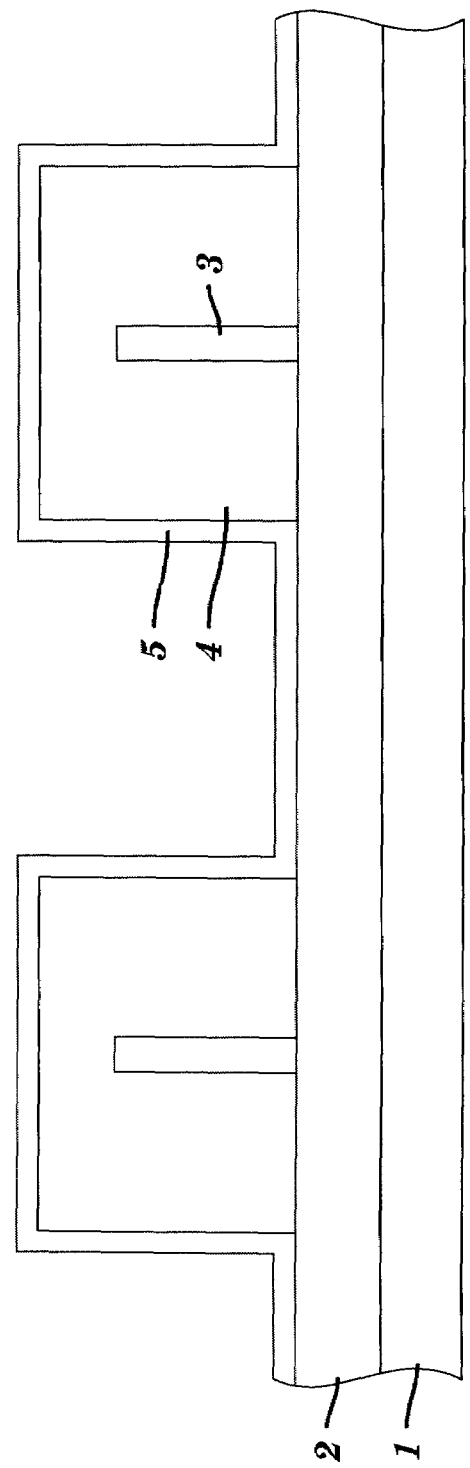

At this point in the process flow, the inventive steps and structures (FIGS. 4-17) to improve device performance for the n-FinFET and p-FinFET devices begin. First, as shown in FIG. 4 and FIG. 5, an $SiO_2$ liner layer (film) 5 is disposed (e.g., deposited) by, e.g., a low temperature deposition technique. The film thickness is in the range of 25-300 Å and the film deposition temperature is in the range of 200-750° C. The film may be deposited by any one of a variety of different known techniques including, but not limited to, sputter deposition, Plasma Enhanced Chemical Vapor Deposition (PECVD), Rapid Thermal Chemical Vapor Deposition (RTCVD), or a standard Chemical Vapor Deposition (CVD) technique. The purpose of this $SiO_2$ film 5 is to act as an etch stop for a second film which is to be deposited next. Thus, the liner or etchstop layer 5 need not be $SiO_2$, but is any material that can provide adequate etch stop capability for the next film that is deposited directly on top of the liner material layer 5.

Figure 6:
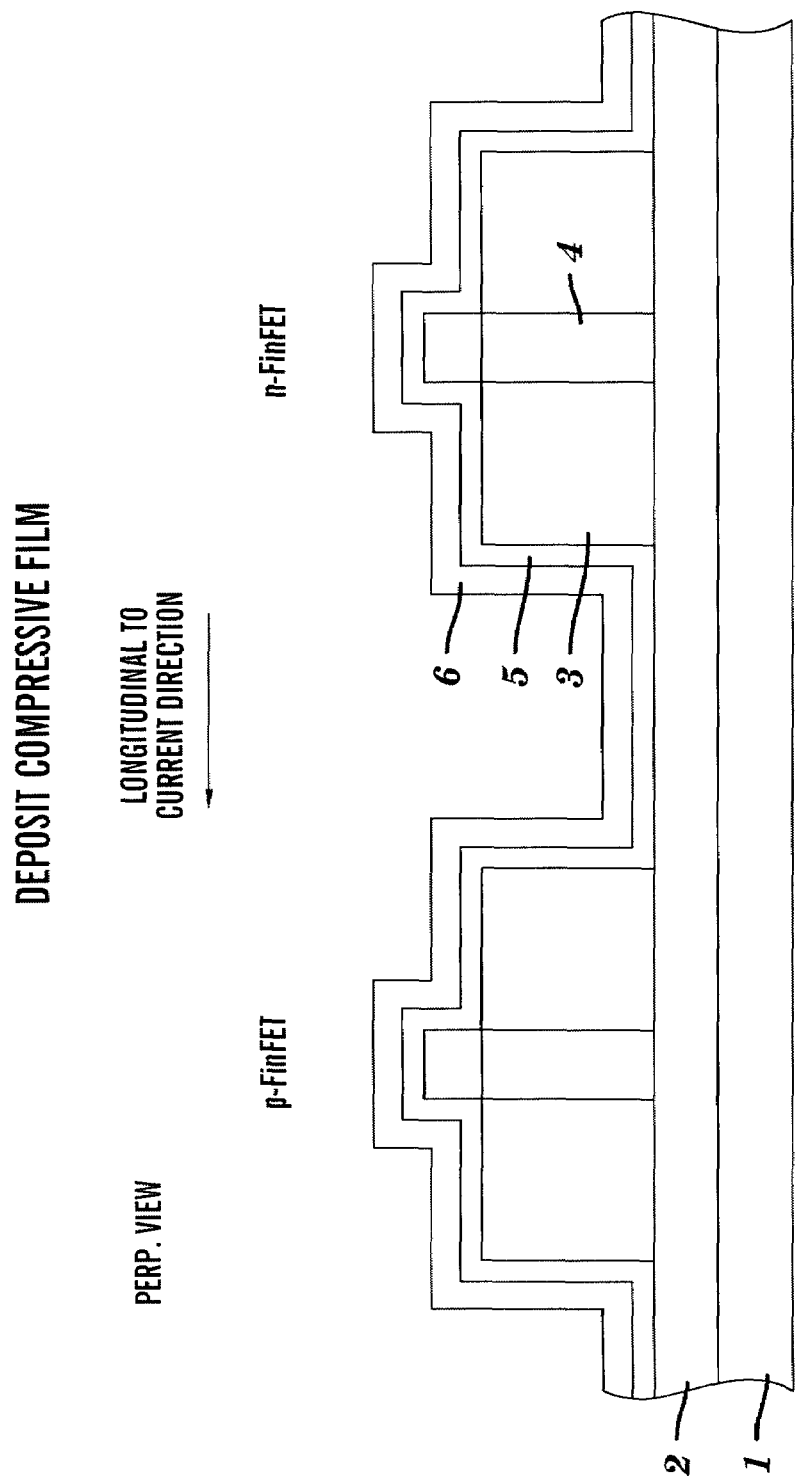
Figure 7:
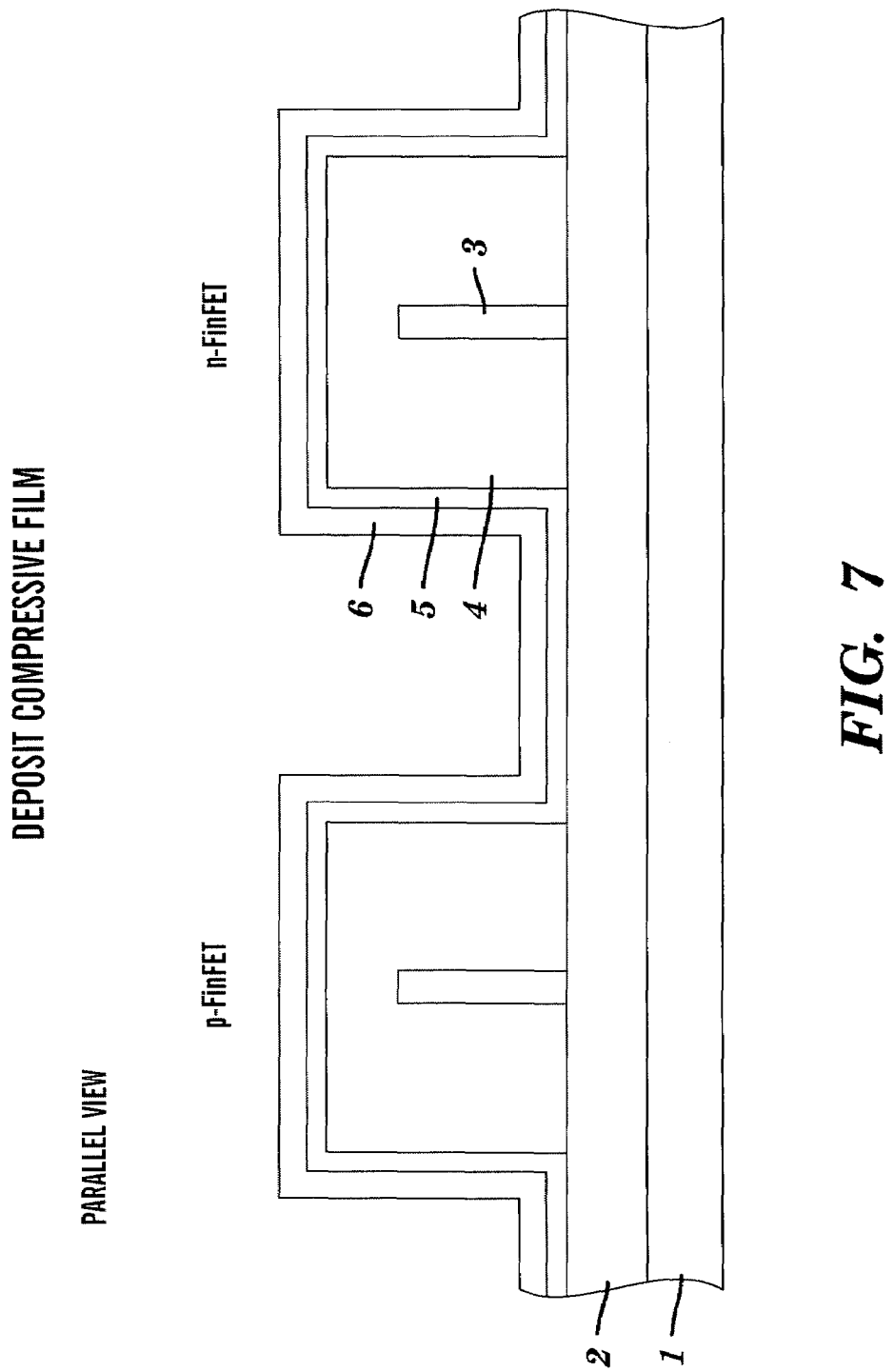

After deposition of the liner or etch stop layer 5, a compressive film 6, as shown in FIG. 6 and FIG. 7, is deposited over the entire wafer. In a preferred embodiment, the compressive film 6 is a SiN film deposited, e.g., by PECVD. The film 6 may also be deposited at an elevated power, in the range 400 W to 1500 W, to create more compression in the film. The film may be deposited using a low deposition rate and temperature range to make the film compressive. Ideally, the compression in the film is in the range of −300 MPa to −300 MPa and the film thickness should be in the range of 200 Å to 2000 Å. Preferred deposition parameters are as follows: process temperature of 480° C., pressure of 5.75 torr, spacing between wafer and electrode of 395 mils, flow 3000 sccm of a 2% diluted $SiH_4$ gas, 15 sccm $NH_3$ gas and 1060 sccm N gas using an RF power of 900 Watts. This process yields a deposition rate of approximately 15.95 Å/s and a film stress of about (±10%) −1400 MPa.

Figure 8:
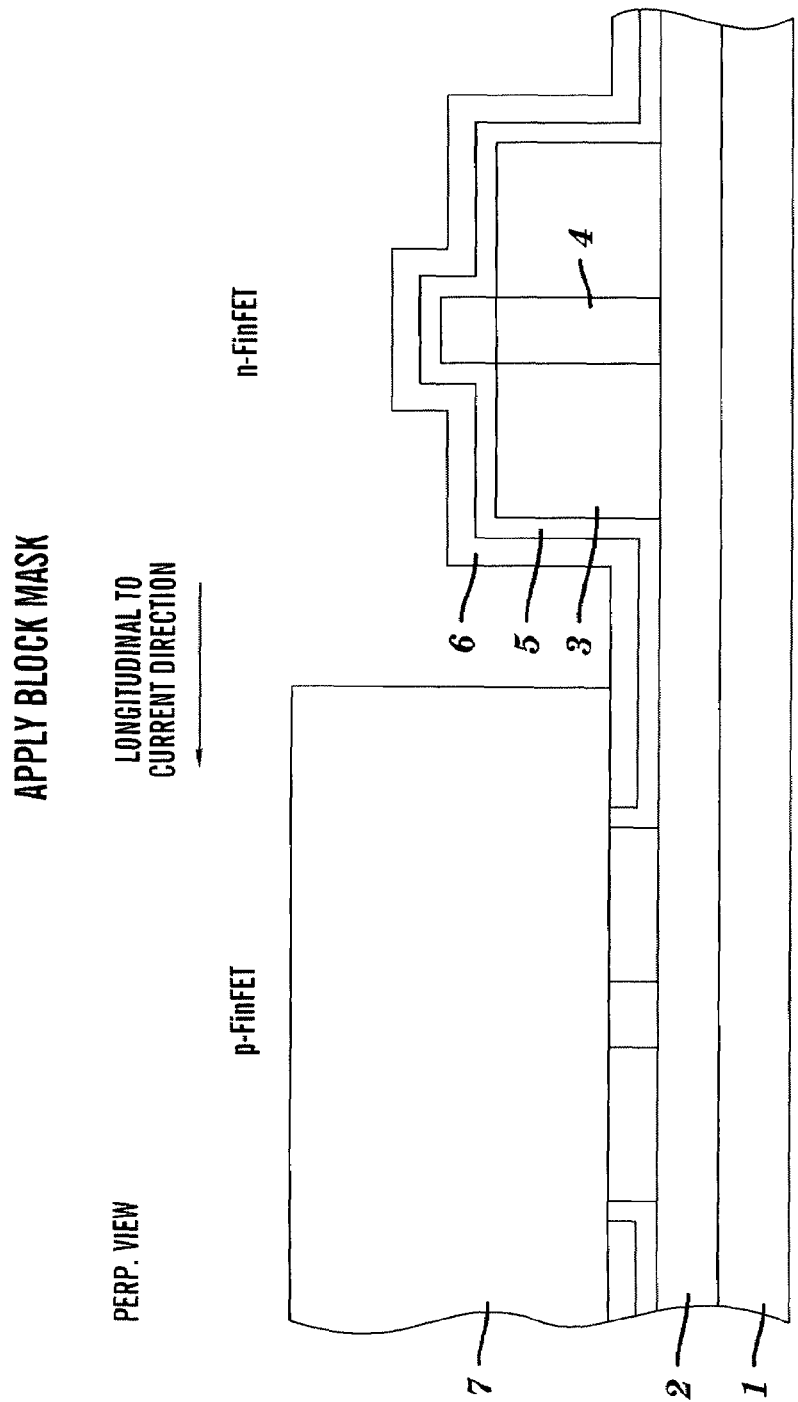
Figure 9:
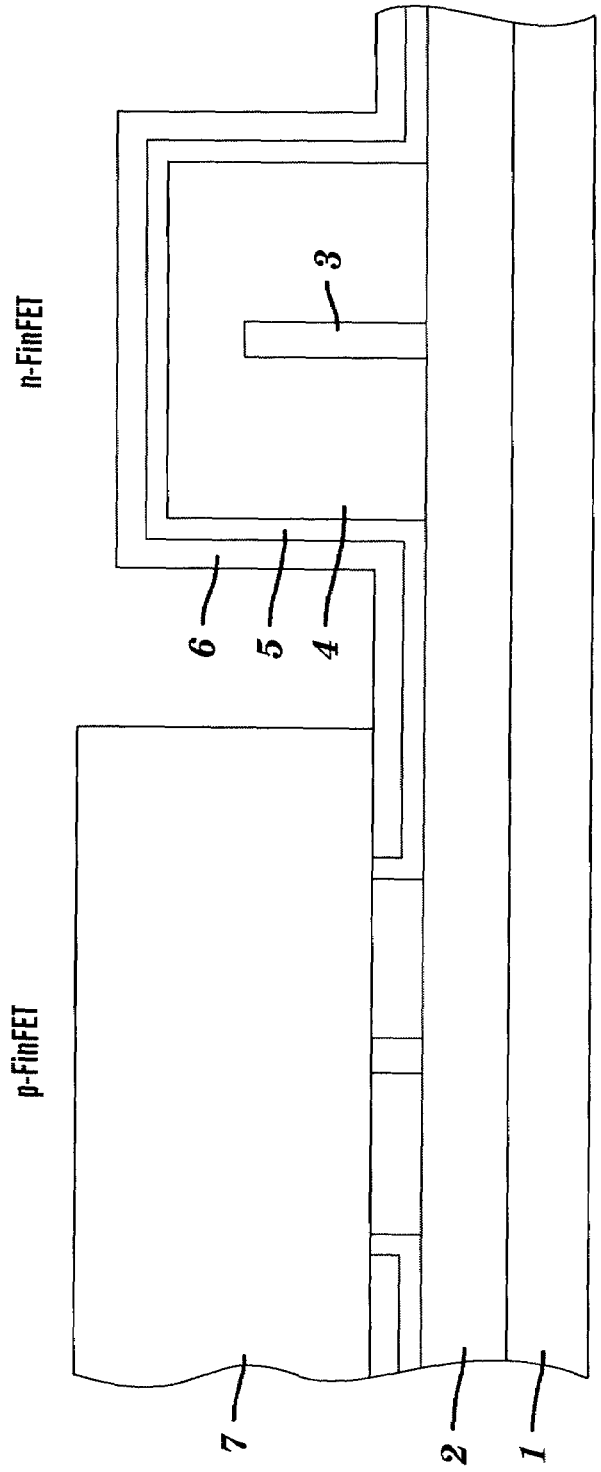

After the compressive film 6 has been applied to the wafer, a block mask 7, as shown in FIG. 8 and FIG. 9, is used to mask to pFET regions of the wafer. This block mask may be formed by conventional lithographic techniques known in the art. The mask is formed by a conventional lithography procedure in which a photosensitive material is coated over the wafer surface and exposed through a mask. The photosensitive material is then developed, leaving resist images or features blocking the pFET areas on the wafer.

Figure 10:
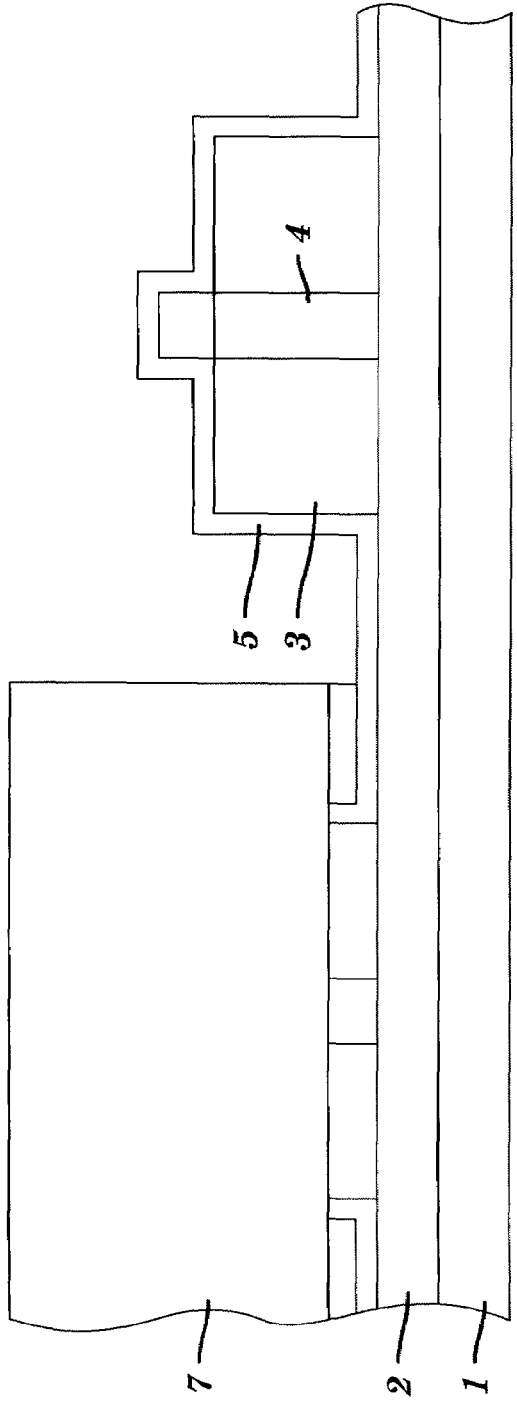
Figure 11:
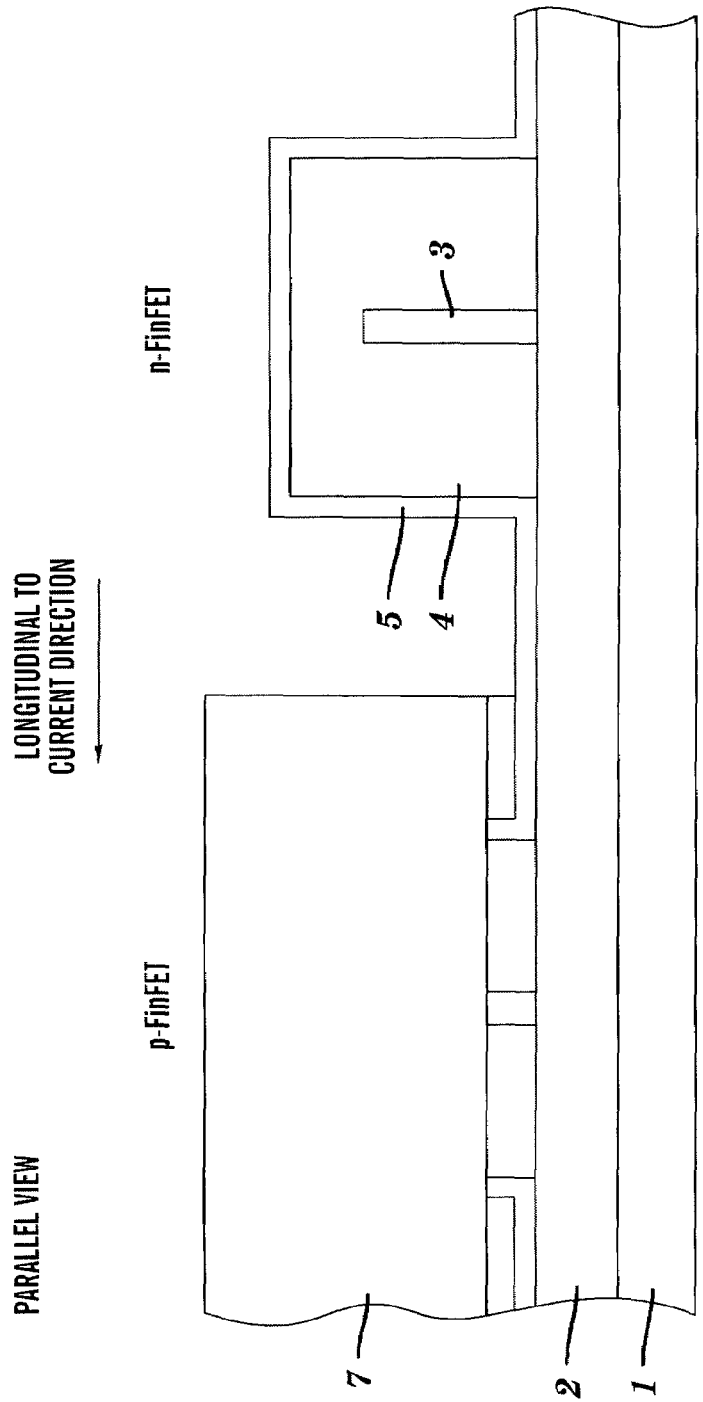

After formation of the block mask 7, the compressive film 6 is removed by a known wet etching or dry etching technique that is capable of removing the compressive film selectively with respect to the block mask material. A plasma consisting of $CH_2F_2$ is an example of a dry etch chemistry that may be used for this purpose if the compressive film is SN. After the compressive film has been removed from the nFET regions on the wafer, an intermediate structure appears as shown in FIG. 10 and FIG. 11.

Figure 12:
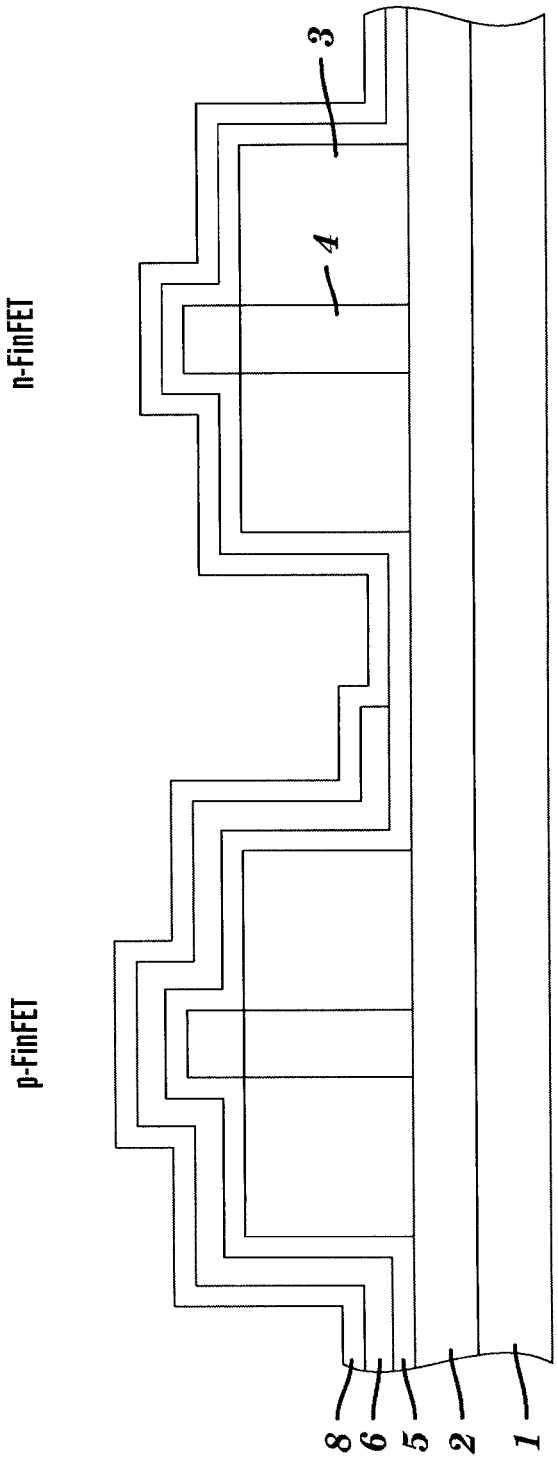
Figure 13:
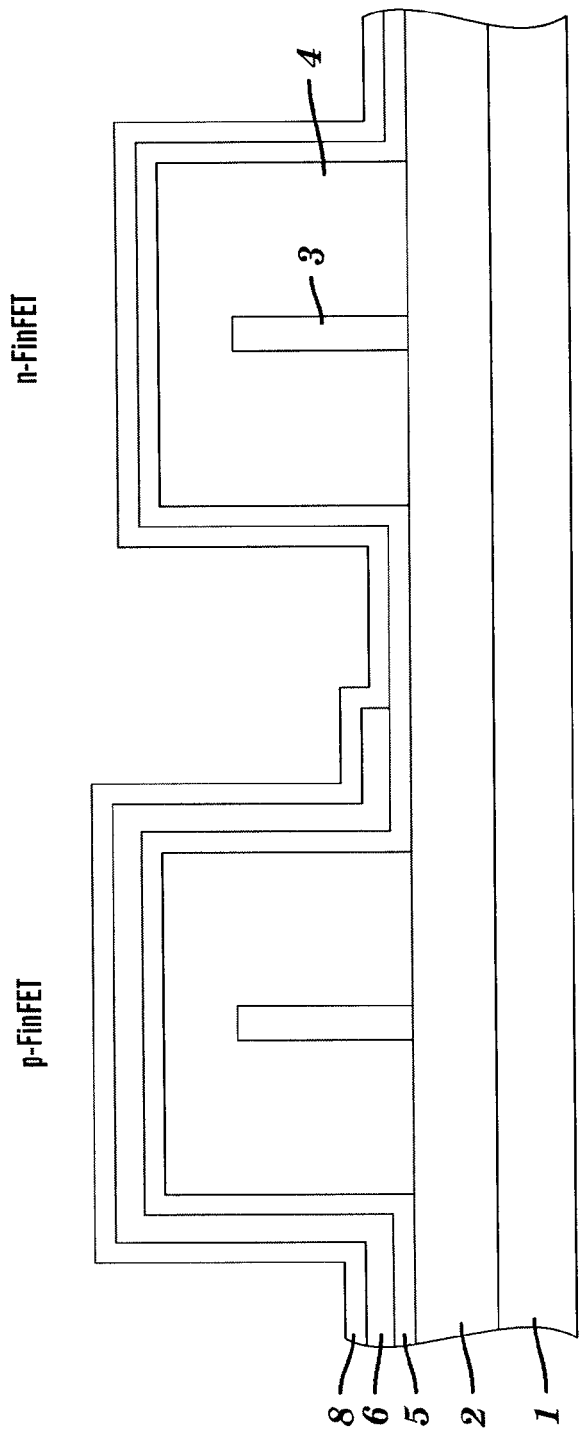

At this point in the inventive process flow, the block mask 7 is removed from the wafer using a solvent or $O_2$ plasma process known in the art to remove resist or organic materials. Next, a second liner or etchstop material 8 is deposited on the entire wafer as shown in FIGS. 12 and 13. The second liner layer 8 has at least similar properties as the first liner previously described. That is, the liner is to be used as an etch stop for a subsequent film etching process.

Figure 14:
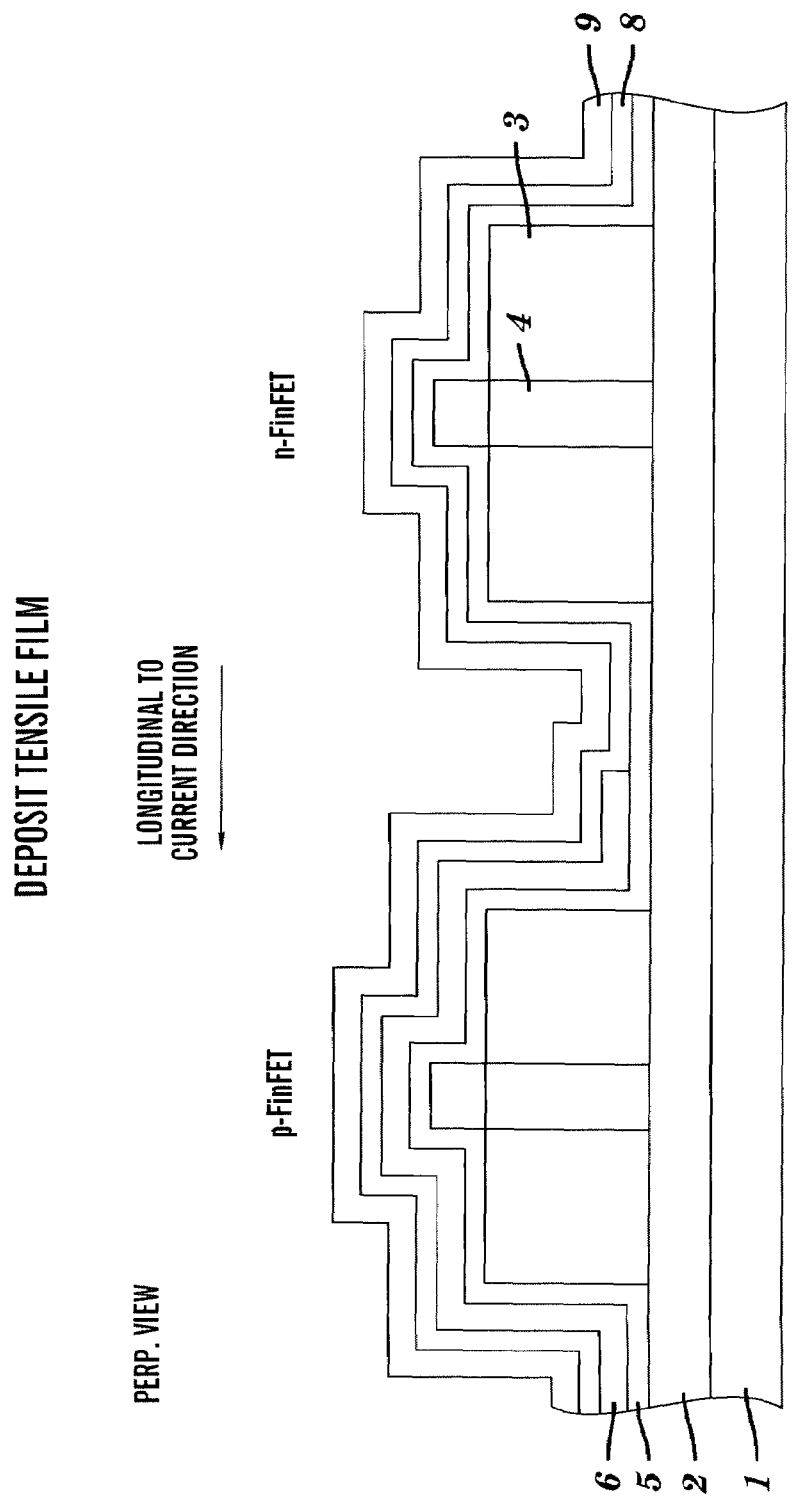
Figure 15:
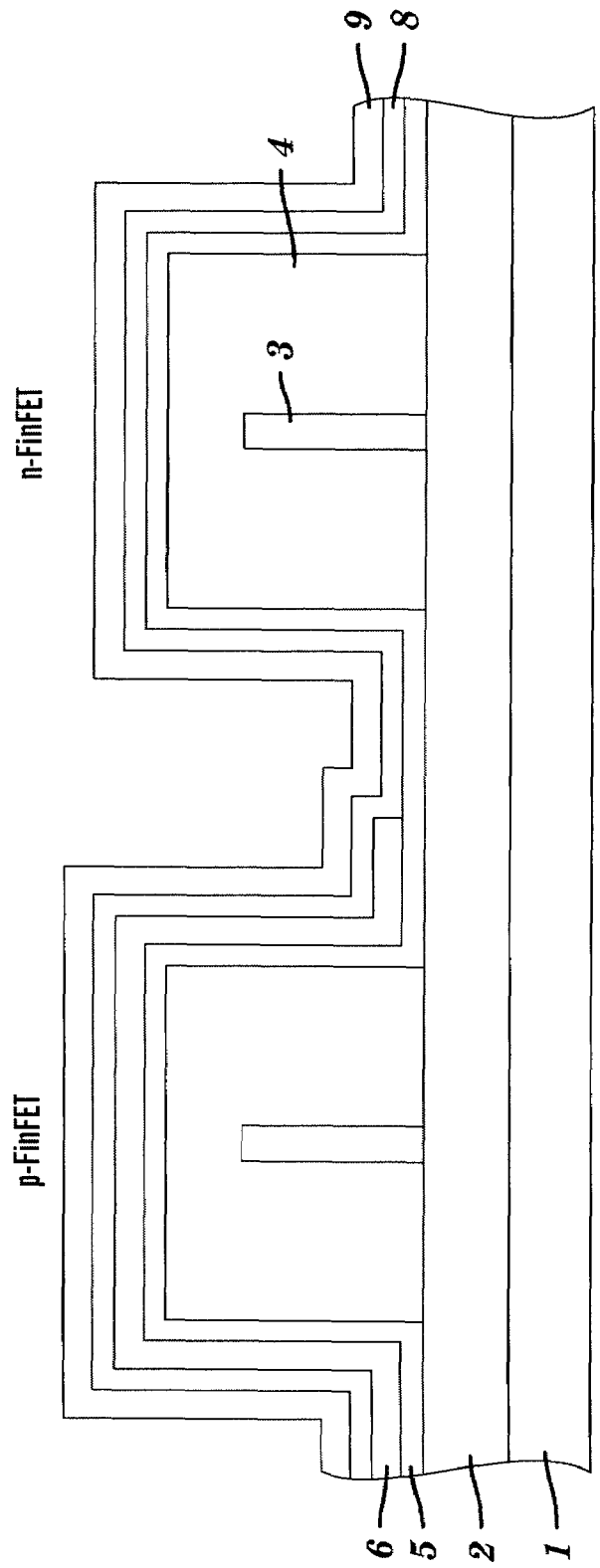

Next, a tensile film 9 is deposited over the entire wafer as shown in FIG. 14 and FIG. 15. The tensile film is, e.g., SiN and is deposited by, e.g., CVD, PECVD, RTCVD or any other deposition technique capable of depositing a highly tensile film. The film thickness should be in the range of 200 Å to 2000 Å, and the stress should be in the range +200 MPa to +2000 MPa or more tensile. Preferred deposition parameters are: process temperature of 480° C., pressure of 6.25 torr, spacing between wafer and electrode of 490 mils, flow 3000 sccm of a 2% dilute $SiH_4$ gas, 15 sccm $NH_3$ gas and 1060 sccm N gas using an RF power of 340 Watts. This process yields a deposition rate of approximately 23 Å/s and a film stress of about 500 MPa.

At this point in the inventive process flow, a block mask 10 is patterned over the nFET regions of the wafer as shown in FIG. 16. The properties of this block mask are similar to the properties of the block mask previously described to block the pFET regions. After the block mask has been defined, a known wet or dry etching procedure is carried out to remove the tensile film 9 from the pFET regions. The etch should be selective to the liner etch stop material 8. In this way, the etch used to remove the tensile film from the nFET regions does not remove the compressive film which is present on the pFET regions. The block mask is next removed using a similar methodology used to remove the first block mask, to result in the final device structure 200, 300 shown in FIG. 17.

At this point in the inventive process flow, a thin film (not shown) in the range of 50 Å to 500 Å, with a low stress in the range of −100 MPa compressive to +100 MPa tensile may be applied to the wafer to serve as a barrier layer. The purpose of this thin film is to fill in any regions not covered by the compressive or tensile films. This optional film may be used to improve the suppression of contamination from penetrating into the Si and also help to improve the etch stop characteristics for the source-drain contact etch.

After the operations described above are carried out, the CMOS process may be continued using standard process methodologies (not shown) well known in the art. More specifically, the processing that follows includes: deposition and planarization of a glass layer (i.e., BPSG, TEOS); etching of source/drain contacts, deposition of contact metallurgy and planarization; additional levels of insulating layers, vias, and wiring are then formed to complete the chip.

The presence of the stressed films on the longitudinal sidewalls of the Fins, overlying the gate conductors, results in a stress in the channel which is of the same type as the stress in the film (i.e., compressive/compressive, tensile/tensile). The stress in the source/drain regions on the longitudinal sidewalls of the Fins is of opposite type (i.e., compressive/tensile, tensile/compressive). To access the source/drain diffusions, the films on the top surface of each Fin may be removed without negating the effects of the film on the longitudinal sidewalls.

While there has been shown and described what is at present considered a preferred embodiment of the present invention, it will be apparent to those skilled in the art that various changes and modifications may be made therein without departing from the spirit and scope of the present invention.

INDUSTRIAL APPLICABILITY

The present invention is applicable to microelectronic semiconductor devices.

The invention claimed is:

1. A semiconductor device structure, comprising:
   a PMOS device and an NMOS device disposed on a substrate,
   the PMOS device including a compressive layer inducing a compressive stress in an active region of the PMOS device in a direction longitudinal to a current direction,
   the NMOS device including a tensile layer inducing a tensile stress in an active region of the NMOS device in a direction longitudinal to the current direction, wherein
   the compressive layer includes a first dielectric material, the tensile layer includes a second dielectric material, and the PMOS and NMOS devices are FinFET devices, and further wherein an etch step layer is disposed under the compressive layer and tensile layer.

2. The semiconductor device as claimed in claim 1, wherein the first dielectric material comprises SiN.

3. The semiconductor device as claimed in claim 1, wherein the second dielectric material comprises SiN.

4. The semiconductor device structure as claimed in claim 1, wherein the first dielectric material has a substantially uniform compressive stress in a range of −300 MPa to −3000 MPa.

5. The semiconductor device structure as claimed in claim 1, wherein the first dielectric material has a substantially uniform thickness in a range of 200 Å to 2000 Å.

6. The semiconductor device structure as claimed in claim 1, wherein the second dielectric material has a substantially uniform tensile stress in a range of +200 MPa to +2000 MPa.

7. The semiconductor device structure as claimed in claim 1, wherein the second dielectric material has a substantially uniform thickness in a range of 200 Å to 2000 Å.

8. The semiconductor device structure as claimed in claim 1, wherein the first dielectric material and the second dielectric material are SiN.

* * * * *